United States Patent [19]

Tsuchiya et al.

[11] 4,308,509
[45] Dec. 29, 1981

[54] FILTER CIRCUIT UTILIZING CHARGE TRANSFER DEVICE

[75] Inventors: Takao Tsuchiya; Mitsuo Soneda, both of Tokyo, Japan

[73] Assignee: Sony Corporation, Tokyo, Japan

[21] Appl. No.: 113,401

[22] Filed: Jan. 18, 1980

[30] Foreign Application Priority Data

Jan. 26, 1979 [JP] Japan .................................. 54/8592

[51] Int. Cl.³ .................... H03H 15/02; H03K 5/135; H01L 29/78; G11C 19/28
[52] U.S. Cl. ................................ 333/165; 307/221 D; 333/166; 333/173
[58] Field of Search ............... 333/165, 173, 166, 167; 307/221 C, 221 D, 221 R; 328/167; 357/24

[56] References Cited

U.S. PATENT DOCUMENTS

| | | | |
|---|---|---|---|
| 3,953,745 | 4/1976 | Bailey | 307/221 C |
| 4,123,733 | 10/1978 | Poirier | 307/221 D |
| 4,195,273 | 3/1980 | Prince | 333/165 |
| 4,232,279 | 11/1980 | Prince | 307/221 D |

Primary Examiner—Marvin L. Nussbaum
Attorney, Agent, or Firm—Lewis H. Eslinger; Alvin Sinderbrand

[57] ABSTRACT

A non-recursive transversal filter circuit employs a charge transfer device in which certain of the capacitive storage elements are divided into first and second capacitive portions having predetermined capacitance relationships. The charge in the second capacitive storage elements is sensed at predetermined times to produce an output signal. The relative capacitances of the second capacitance portions provide weighting factors to the filter. Embodiments include bucket brigade devices with bipolar and FET transistors as well as charge coupled devices.

13 Claims, 18 Drawing Figures

FILTER CIRCUIT UTILIZING CHARGE TRANSFER DEVICE

BACKGROUND OF THE INVENTION

1. Field of the Invention

The present invention relates generally to a filter circuit utilizing a charge transfer device such as a bucket brigade device or a charge coupled device, and is directed more particularly to a non-recursive transversal filter.

2. Description of the Prior Art

In general, a prior art filter circuit using a bucket brigade device may be as shown in FIG. 1. In simplest terms, a bucket brigade device periodically stores an input analog or digital signal from an input terminal 1 in a capacitor C0, then passes the stored charge a step at a time from left to right through capacitors C1, C2, .... At each step, a new input signal value is stored in C0. Thus, a moving stream of stored charges are moved along the bucket brigade device.

Input terminal 1 applies a signal voltage $V_S$ to the base of a PNP transistor 2 whose collector is grounded and whose emitter is connected through a resistor 3 to a power supply terminal maintained at a supply voltage $+V_{CC}$ and also through the cathode terminal of a diode 5 to a hot side of capacitor C0. The other or cold side of capacitor $C_0$ is connected to a clock terminal 6. The hot side of capacitor C0 is also connected to the emitter of an NPN transistor Q1 whose collector is connected to the emitter of an NPN transistor Q2 of the next stage. Similarly, the collectors and emitters of NPN transistors Q2, Q3, ... are connected together, and capacitors C1, C2, ... are connected between the bases and collectors of the respective transistors Q1, Q2, ..., respectively. The capacitance of capacitors C0, C1, C2, ... are all equal to the same capacitance value C. The bases of odd numbered transistors Q1, Q3, ... are connected through a clock terminal 7 to a clock driver 8. The bases of even numbered transistors Q2, Q4, ... are connected through clock terminal 6 to clock driver 8, respectively.

Clock terminals 6 and 7 are supplied with clock signals $\phi_1$ and $\phi_2$ (FIGS. 2A and 2B respectively) which have potentials or levels $V_{DC}$ and $V_{DC}+V_P$, at a 50% duty cycle. Clock signals $\phi_1$ and $\phi_2$ are 180° out of phase. The voltage $V_P$ satisfies condition (1) with respect to supply voltage $V_{CC}$ at power supply terminal 4.

$$V_{CC} > V_{DC} + 2V_P \quad (1)$$

Further, signal voltage $V_S$ at input terminal 1 satisfies condition (2).

$$V_{DC} + V_P \leq V_s \leq V_{DC} + 2V_P \quad (2)$$

The voltage $V_{DC}$ applied to the bases of transistors Q1, Q2, Q3, ... is insufficient to turn them on but the voltage $V_{DC}+V_P$ is sufficient to bias them into their active regions.

As an initial condition, assume that all capacitors are charged to voltage $V_P$ and that signal voltage $V_S$ applied to input terminal 1 is a first DC value $V_{S1}$. Signal voltage $V_{S1}$ is thus applied to the cathode of diode 5. At time $t_o$ (FIG. 2A), the clock signal $\phi_1$ changes to $V_{DC}+V_P$ and clock signal 2 changes to $V_{DC}$. The voltage $V_{DC}$ at the base of transistor Q1 cuts off this transmission. The voltage $V_{DC}+V_P$ at the upper or cold side of capacitor $C_o$ produces a voltage of $V_{DC}+2V_P$ (FIG. 2C) at the lower or hot side of capacitor C0. According to equation (2), this voltage at the hot side of capacitor C0 and at the anode of diode 5 exceeds the signal voltage $V_{S1}$ at the cathode of diode 5. Thus the charge in capacitor C0 bleeds off through diode 5 until the voltage at the hot side of capacitor C0 equals the signal voltage $V_{S1}$. The charge remaining in capacitor C0 at this time is $\{V_{S1}-(V_{DC}+V_P)\}C$.

At time $t_1$ (FIG. 2A), clock signal $\phi_1$ decreases to voltage $V_{DC}$. The voltage at the hot side of capacitor C0 is changed to $V_{S1}-V_P$ (FIG. 2C). At the same time, clock signal $\phi_2$ (FIG. 2B) is increased to voltage $V_{DC}+V_P$. This voltage, applied to the base of transistor Q1, biases transistor Q1 into its active region. The same voltage applied to the cold side of capacitor C1 produces a voltage $V_{DC}+2V_P$ (FIG. 2D) at the hot side of capacitor C1. Transistor Q2 is cut off by clock signal $\phi_1$ at its base. An amount of charge is fed from capacitor C1 through the collector-emitter path of transistor Q1 to increase the voltage at the hot side of capacitor C0 to $V_{DC}+V_P$. This occurs due to the voltage $V_{DC}+V_P$ at the base of transistor Q1. Since the voltage at the hot side of capacitor C0 changes from $V_{S1}-V_P$ to $V_{DC}+V_P$, the charge transferred from the hot side of capacitor C1 to the hot side of capacitor C0 is expressed by equation (3).

$$\{(V_{DC}+V_P)-(V_{S1}-V_P)\}C = (V_{DC}+2V_P-V_{S1})C \quad (3)$$

Since a charge of $V_P \cdot C$ was initially stored in the capacitor C1, its final charge is given as follows:

$$V_P \cdot C - (V_{DC}+2V_P-V_{S1})C = \{V_{S1}-(V_{DC}+V_P)\}C \quad (4)$$

That is, during the period $t_o$ to $t_1$, a voltage is stored in capacitor C0 which is equal to $V_{S1}-(V_{DC}+V_P)$. This voltage is transferred to capacitor C1 during the period $t_1$ to $t_2$ so that the voltage on capacitor C0 returns to $V_{DC}+V_P$. Since transistor Q2 is OFF at this time, capacitors C2, C3, ... are not affected.

Further, during period $t_2$ to $t_3$, signal voltage $V_S$ may assume a value $V_{S2}$. Capacitor C0 is charged to $V_{S2}-(V_{DC}+V_P)$ while capacitor C1 is returned to $V_{DC}+V_P$ by this voltage at the base of transistor Q2. By the process previously described, capacitor C2 is charged to $V_{S1}-(V_{DC}+V_P)$. Since the transistor Q3 is OFF, capacitors C3, ... are not affected. The above operation is repeated and the signal is transferred from left to right on FIG. 1 in synchronism with clock signals $\phi_1$ and $\phi_2$.

When a transversal filter of, for example, a non-recursive type is formed using the above bucket brigade device, a plurality of intermediate taps are provided at appropriate points in the sequence. This has the effect of providing signals with different delay times which may be weighted in a predetermined way and added successively to produce an output signal.

The hot sides of capacitors C0, C2 and C4, from which signals are derived, are connected to the bases of emitter follower transistors 91, 92 and 93, respectively. The emitters of the transistors 91, 92 and 93 are connected to input terminals of differential amplifiers 94, 95 and 96, respectively. The other input terminals of differential amplifiers 94, 95 and 96 are connected to a constant voltage source represented by a battery. Outputs of differential amplifiers 94, 95 and 96 are commonly connected through an emitter follower transistor 98 to an output terminal 10.

The signals from the intermediate taps are delivered through emitter follower transistors 91, 92 and 93 and added in an analog manner in differential amplifiers 94, 95 and 96. The voltages may be weighted by adjusting the gains of the differential amplifiers to desired values.

Analog adding by differential amplifiers, as in the prior art, requires an excessive number of components with a resultant high power dissipation. Also, slight imbalance in the gain adjustment of the differential amplifiers may upset the balance of the circuit and produce scattering in the DC level. As a consequence, the correct relationships between input and output may not be achieved or the output DC level may become unstable.

Further, due to the presence of the collector-base capacitance $C_{CB}$ of emitter follower transistors 91, 92 and 93, the effective pulse height of the clocking signal is reduced by a factor of $C/(C+C_{CB})$ and the dynamic range of the signal is proportionately lowered. Also, the signal is affected by the base current of emitter follower transistors 91, 92 and 93. Therefore, a non-recursive transversal filter utilizing the circuit shown in FIG. 1 is not satisfactory.

OBJECTS AND SUMMARY OF THE INVENTION

Accordingly, it is an object of the present invention to provide a novel filter circuit utilizing a charge transfer device.

It is another object of the invention to provide a non-recursive transversal filter circuit utilizing a charge transfer device free of the defects of the prior art.

According to an aspect of the invention, there is provided a filter circuit comprising a charge transfer device, a clock signal drive circuit including means for supplying a clock signal to the charge transfer device, the charge transfer device including a plurality of successive capacitive storage means for sequentially holding a charge level representing a time sampled input signal, each of the capacitive storage means having a clocking electrode for receiving the clock signal so that the charge level is transferred from one to another of the capacitive storage means in succession in response to the clock signal, a predetermined plurality of the plurality of capacitive storage means being divided into first and second capacitive portions connected in parallel for the transfer and having a selected capacitive ratio, the first capacitive portions having the respective first mentioned clocking electrodes for receiving the clock signal and the second capacitive portions having respective second clocking electrodes, a first connection point connected to a predetermined number of the second clocking electrodes, a second connection point connected to the remaining number of the second clocking electrodes, the clock signal drive circuit further including first and second clock driver circuits operated in synchronism with the clock signal and connected to the first and second connection points, respectively, current detecting means for detecting currents flowing through the first and second clock driver circuits, respectively, and output means for compounding the detected currents and deriving an output signal.

The above, and other objects, features and advantages of the present invention, will become apparent from the following description read in conjunction with the accompanying drawings, in which like reference numerals designate the same elements.

DESCRIPTION OF THE PREFERRED EMBODIMENTS

Figure 3:
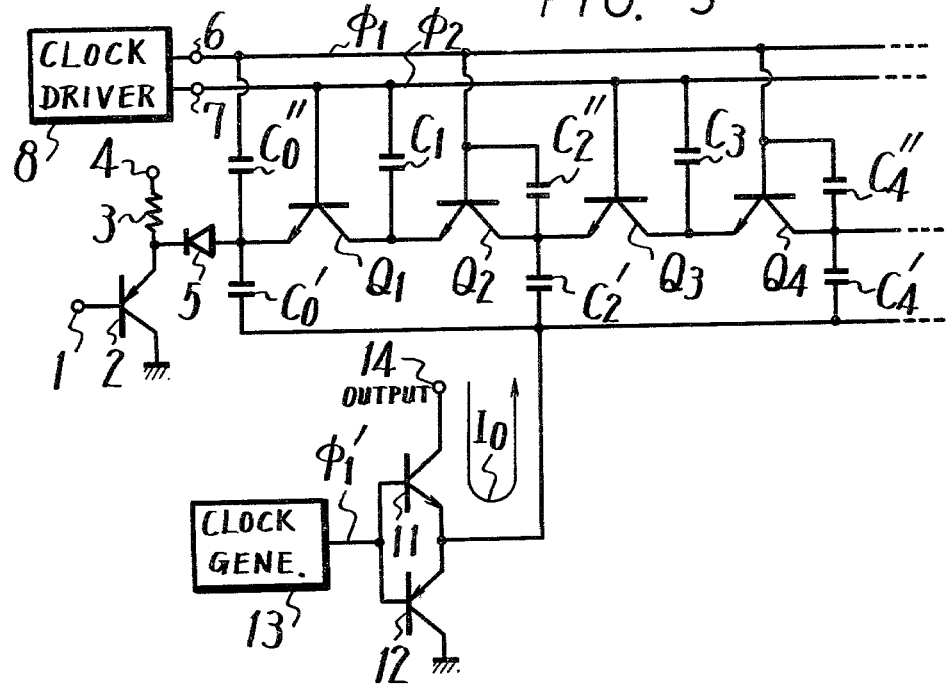
FIGS. 3 to 15 are schematic diagrams of filters according to a number of embodiments of the present invention.

Referring now to FIG. 3, a bucket brigade device according to the present invention includes a plurality of even numbered capacitors C0, C2, ... which are divided into capacitors portions C0', C0''; C2', C2''; ... The capacitances of the capacitor portions are a0C, (1−a0)C; a2C, (1−a2)C; ... so that the sum of the pairs of corresponding portions is C. The cold sides of even numbered primed divided capacitors C0', C2', ... are connected together, and the cold sides of even numbered double primed divided capacitors C0'', C2'', ... are connected to clock terminal 6.

Complementary transistors 11 and 12 have their emitters connected together and to a common point of the cold sides of even numbered divided capacitors C0', C2', ... and their bases connected together to the output side of a clock signal generator 13. Clock signal generator 13 delivers a clock signal $\phi1'$ which has the same phase as clock signal $\phi1$ and provides voltages of $V_{DC}-V_{BE}$ and $V_{DC}+V_P+V_{BE}$ (where $V_{BE}$ is the base-emitter voltage of transistors 11 and 12). The collector of PNP transistor 12 is grounded and the collector of NPN transistor 11 is connected to an output terminal 14.

Figure 1:
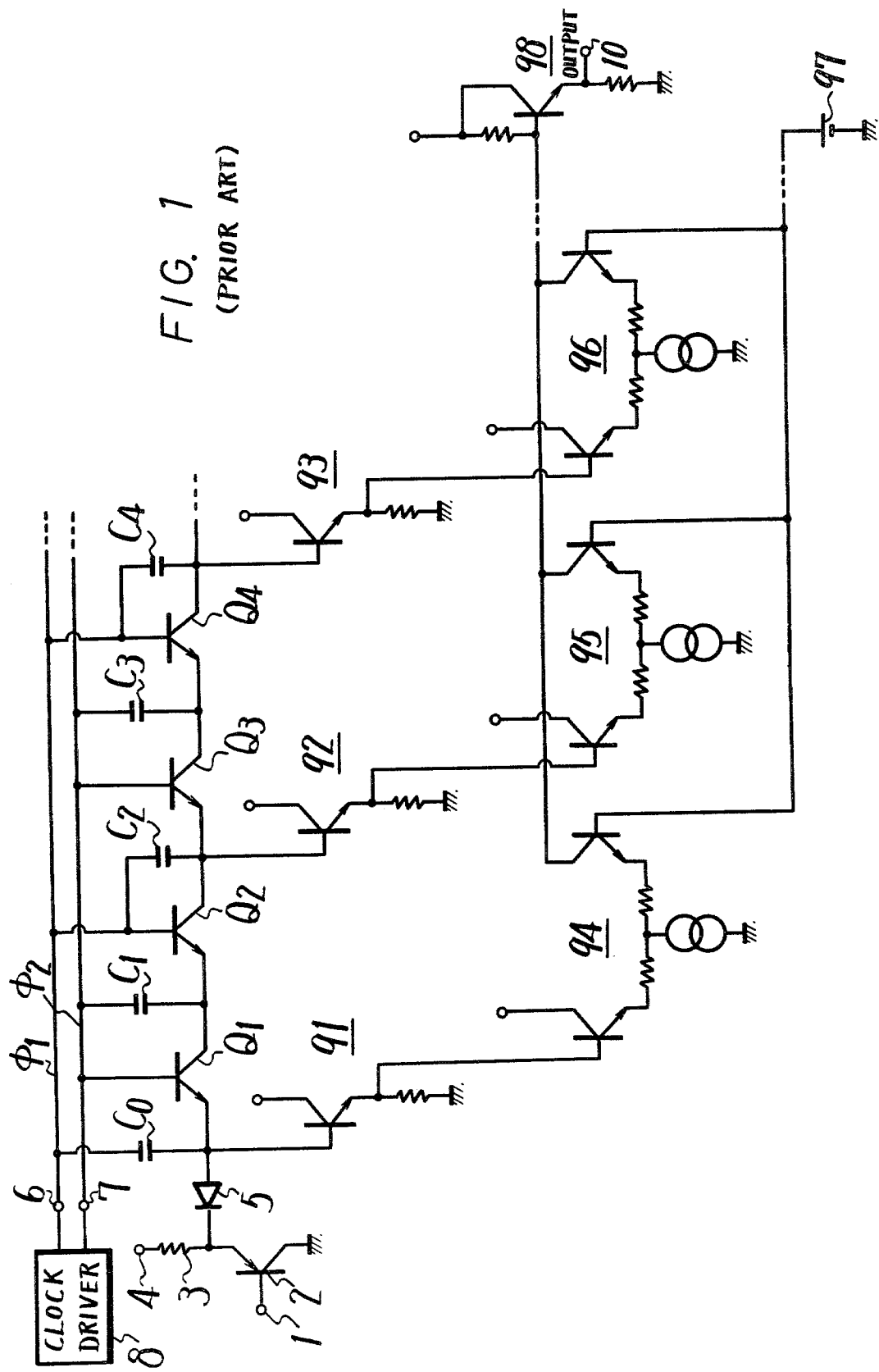
FIG. 1 is a schematic diagram of a filter circuit according to the prior art.
Figure 2A:
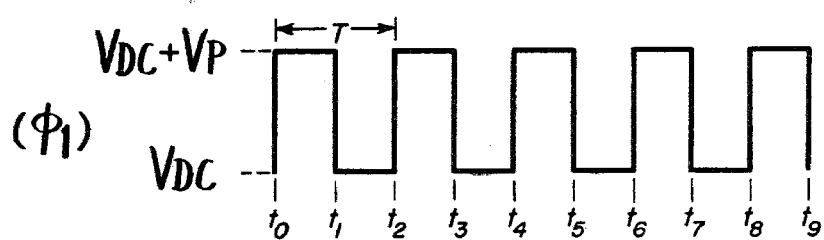
FIGS. 2A to 2D are waveforms to which reference will be made in explaining the operation of filter circuits in the prior art and the present invention.
Figure 2B:
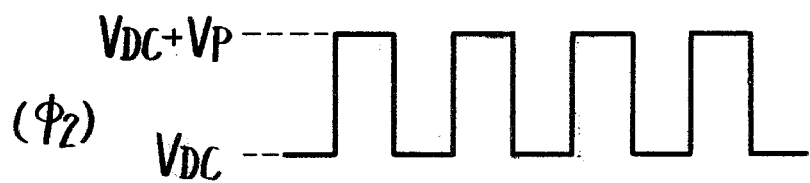
Figure 2C:
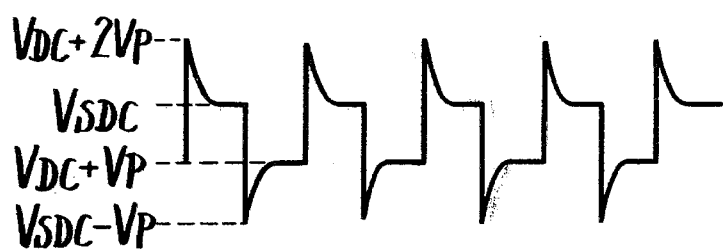
Figure 2D:
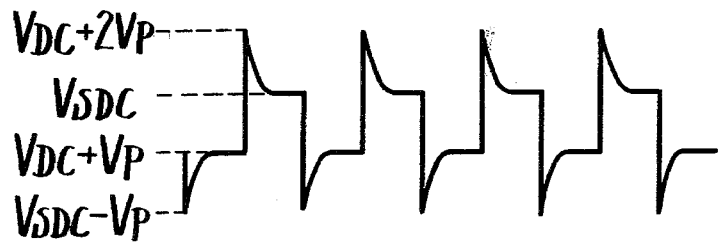

With no input signal, the voltages at the hot sides of all of capacitors C0', C0'', C2', C2'', ... are $V_P$. During the first period from $t_0$ to $t_1$ when clock signal $\phi1$ is at the level of $V_{DC}+V_P$ (FIG. 2A), if a first input signal $V_{S1}$ is applied to input terminal 1, the voltage across capacitor C0' is changed from $V_P$ to $V_{S1}-V_{DC}+V_P$. During this period, a charge of $$a0CV_P - a0C\{V_{S1} - (V_{DC} + V_P)\} = a0C\{(V_{DC} + 2V_P) - V_{S1}\} \quad (5)$$

is discharged through the collector of transistor 11. One clock period $\tau(\tau=1/f_c$ where $f_c$ is the clock frequency), later from $\tau_2$ to $\tau_3$ during the clock signal $\phi1$, the capacitor C2' is discharged through transistor 11. At this time, the charge is expressed as follows:

$$a2CV_P - a2C\{(V_{S1} - (V_{DC} + V_P)\} = a2C\{(V_{DC} + 2V_P) - V_{S1}\} \quad (6)$$

At the same time a second input signal $V_{S2}$ may be accepted in capacitor portion C0'.

An additional clock period later from $t_4$ to $t_5$ of clock signal $\phi1$, a charge expressed by the following equation (7) is discharged from capacitor C4' through the collector of transistor 11.

$$a4CV_P - a4C\{V_{S1} - (V_{DC} + V_P)\} = a4C\{(V_{DC} + 2V_P) - V_{S1}\} \quad (7)$$

Since all discharging charges from all of capacitor portions C0', C2', C4'... flow through the collector of transistor 11, the total charge $Q_{OUT}$ flowing through the collector of transistor 11 is expressed as follows:

$$Q_{OUT} = \{(V_{DC} + 2V_P) - V_S\} C(a0 + a2Z^{-1} + a4Z^{-2}...) \quad (8)$$

where $Z = e^{s\tau}$, $S = jw = j2\pi f$ and f is the frequency of the input signal.

A summed signal is thus derived at the collector of transistor 11 which corresponds to the successive samples of the input signal $V_S$ successively delayed by 0, $\tau$, $2\tau$, ..., weighted by a0, a2, a4, ... and then added. Thus, with selected values of a0, a2, ..., a filter having a predetermined transfer function is formed.

The average or mean value $I_{AV}$ of the collector current of transistor 11 is expressed as follows:

$$I_{AV} = Q_{OUT}/\tau = Q_{OUT} f_c \quad (9)$$

The embodiment of the invention in FIG. 3 produces an output in the form of a current $I_0$. The embodiment of FIG. 4 produces a voltage output signal. The collector of transistor 11 is connected through the collector-emitter path of an NPN transistor 31 to power supply terminal 4 and the base of transistor 31 is connected to clock terminal 7. At the same time, a capacitor 32 with a capacitance of $C_A$ is connected at one terminal to the junction of the collector and emitter transistors 11 and 31 respectively and at the other terminal to clock terminal 6. An output terminal 33 is connected to the connection point between the collector of transistor 11 and the emitter of transistor 31. The initial charge on capacitor 32 is $V_P \cdot C_A$.

A charge $Q_{OUT}$ is transferred through transistor 11 as in the previous embodiment. The charge on capacitor 32 becomes $V_P C_A - \{(V_{DC}+2V_P)-V_S\} C(a0+a2Z^{-1}+...)$ during the high periods $(V_{DC}+V_P)$ of clock signal $\phi 1$ and hence the potential of the signal voltage is added at input terminal 1. Thus, the output voltage $V_{OUT}$ is expressed as follows:

$$V_{OUT} = \frac{V_P C_A - \{(V_{DC} + 2V_P) - V_S\} C(a0 + a2Z^{-1} + ...)}{C_A} + \quad (10)$$

$$V_{DC} + V_P = \frac{C}{C_A}(a0 + a2Z^{-1} + ...)V_S +$$

$$\frac{V_P C_A - (V_{DC} + 2V_P) C(a0 + a2Z^{-1} + ...)}{C_A} +$$

$$V_{DC} + V_P$$

If $V_S + V_{SDC} + V_{SAC}$ (where $V_{SDC}$ = the DC signal component and $V_{SAC}$ = the AC signal component), the voltage $V_{OUT}$ can be rewritten as follows:

$$V_{OUT} = \frac{C}{C_A}(a0 + a2Z^{-1} + ...)V_{SAC} + \quad (11)$$

$$\frac{V_P C_A - (V_{DC} + 2V_P - V_{SDC}) C(a0 + a2Z^{-1} + ...)}{C_A} +$$

$$V_{DC} + V_P$$

In the above formula, the first term is the AC signal term and all other terms are DC component terms. Since f=0 in the DC component terms, $Z^{-1} = Z^{-2} = ... = 1$. Therefore, the voltage $V_{OUT}$ is expressed as follows:

$$V_{OUT} = \frac{C}{C_A}(a0 + a2Z^{-1} + ...)V_{SAC} + \quad (12)$$

$$\frac{V_P C_A - (V_{DC} + 2V_P - V_{SDC}) C(a0 + a2 + ...)}{C_A} +$$

$$V_{DC} + V_P$$

Figure 4:
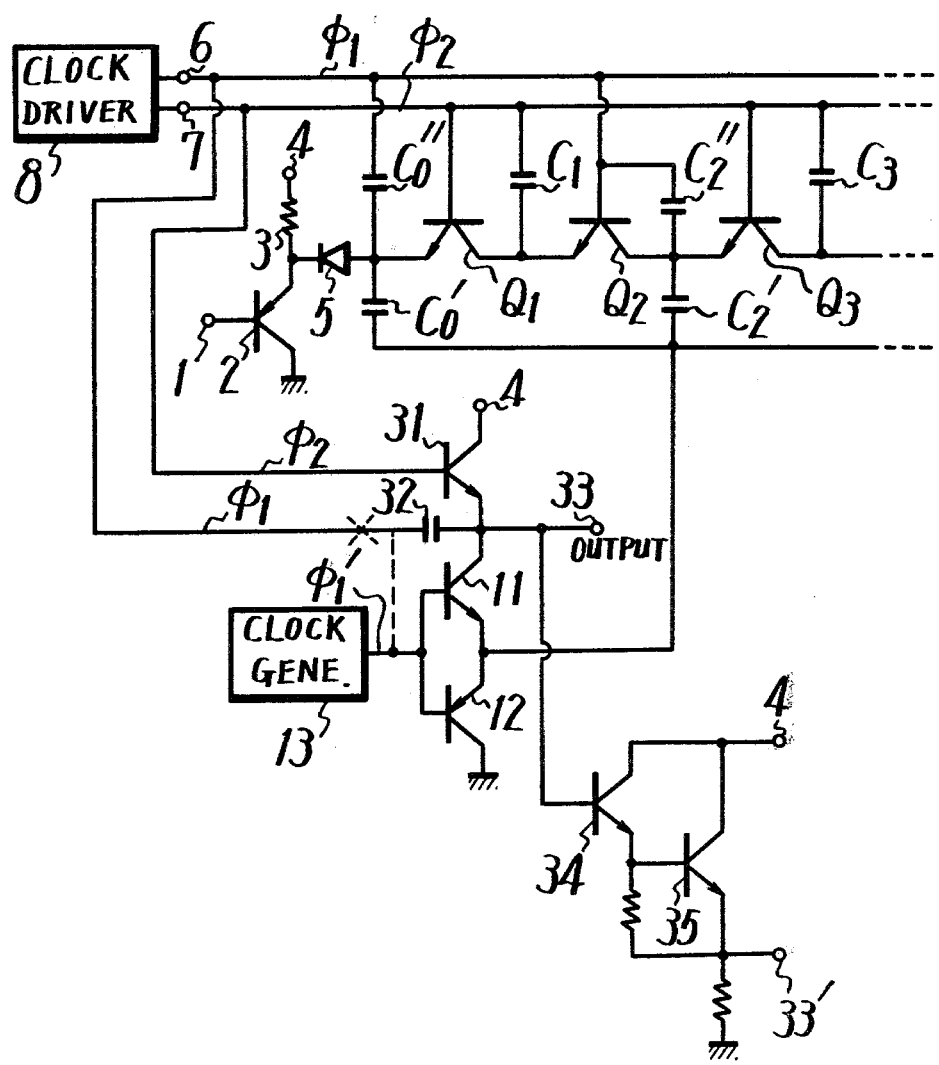

That is, in the circuit shown in FIG. 4, an output signal of $C/C_A (a0 + a2Z^{-1} + ...) V_{SAC}$ is produced in response to the AC signal component. At this time, the DC signal component in the output is as follows:

$$\frac{V_P C_A - (V_{DC} + 2V_P - V_{SDC}) C(a0 + a2 + ...)}{C_A} + V_{DC} + V_P$$

Thus, a DC level shift of $$\frac{V_P C_A - (V_{DC} + 2V_P - V_{SDC}) C(a0 + a2 + ...)}{C_A} +$$

$$V_{DC} + V_P - V_{SDC}$$

is produced.

Transistor 2 and diode 5 at the input side of the bucket brigade device, increases the DC potential by $2V_{BE}$. The DC potential may be reduced using a two-stage cascaded emitter follower circuit using transistors 34 and 35 to produce an output at alternate output terminal 33'. The emitter followers have the additional advantage of reducing the current required from the circuit to produce the output.

Alternatively, one end of capacitor 32 may be connected to clock signal generator 13 as indicated by the broken line rather than to clock terminal 6. When connected this way, the output voltage $V_{OUT}$ becomes as follows:

$$V_{OUT} = V_{S1} + 2V_{BE} \quad (13)$$

Figure 5:
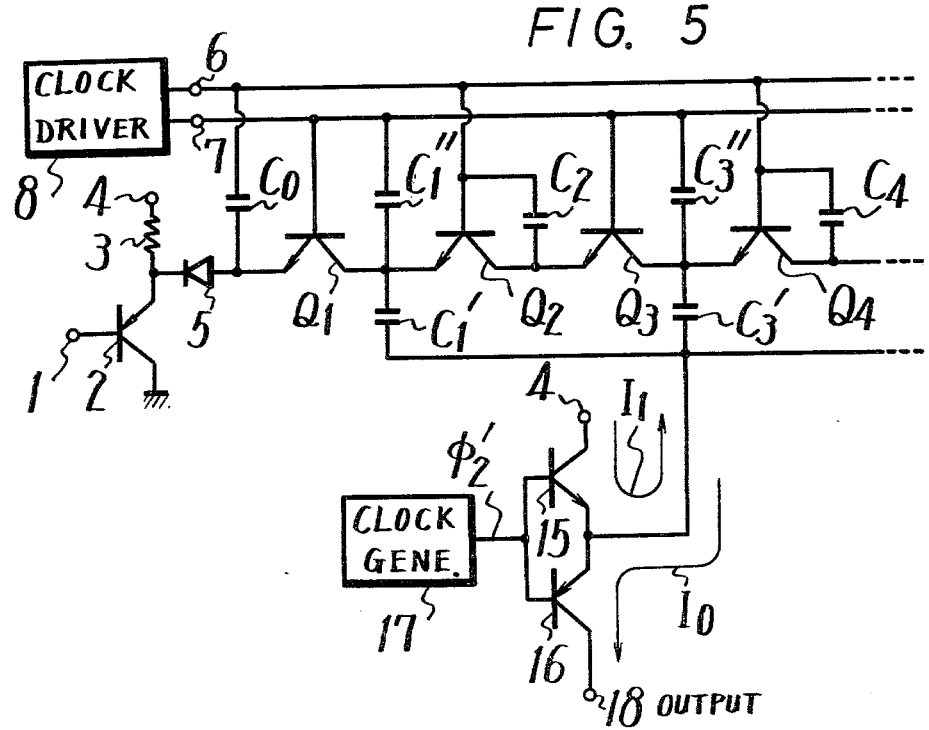

FIG. 5 shows an embodiment of a bucket brigade device in which the signal is passed beyond the input capacitor C0 before it is called upon to produce an output signal. Odd numbered capacitors C1, C3, ... are divided into capacitor portions C1', C1''; C3', C3''; ... whose capacitances are a1C, (1−a1)C; a3C, (1−a3)C; ... The cold sides of the odd numbered primed capacitor portions C1', C3', ... are connected together, and the cold sides of the odd numbered double primed capacitor portions C1'', C3'', ... are connected to clock terminal 7.

Complementary transistors 15 and 16 have their emitters connected together to the connection point of the cold sides of divided capacitors C1', C3', ... and their bases connected together to the output side of a clock signal generator 17. Clock signal generator 17 delivers a clock signal $\phi 2'$ which has the same phase as the clock signal $\phi 2$ and which assumes voltages of $V_{DC} - V_{BE}$ and $V_{DC} + V_P + V_{BE}$ (where $V_{BE}$ is the base-emitter voltage of transistor 15 and 16). The collector of NPN transistor 15 is connected to power supply terminal 4 and the collector of PNP transistor 16 is connected to an output terminal 18.

When no input signal voltage is supplied, the terminal voltages of all divided capacitor portions C1', C1'', C3', C3'', ... are $V_P$. Between $t_0$ and $t_1$ (FIG. 2A) of clock signal $\phi 1$ if a signal voltage S1 is applied to input terminal 1, capacitor C0 is charged up to a terminal voltage of $V_{S1} - (V_{DC} + V_P)$. During the period $t_1$ to $t_2$ clock signal $\phi 2$ enables a charge of $a1C\{(V_{DC}+2 V_P) - V_{S1}\}$ to flow to capacitor portion C1' from transistor 15 in the direction of an arrow I1. During the period $t_2$ to $t_3$, clock signal $\phi_1$ transfers the same charge through transistor 16 in the direction of an arrow I0.

During the period $t_3$ to $t_4$, a charge of $a3C\{(V_{DC}+2V_P)-V_{S1}\}$ flows from capacitor C3' through transistor 16 in the direction of the arrow I0.

During the period $t_4$ to $t_5$, a charge of $a5C\{(V_{DC}+2V_P)-V_{S1}\}$ flows from capacitor C5 through the collector of transistor 16.

The total amount of charge $Q_{OUT}$, which flows through the collector of transistor 16 at this time, is expressed as follows:

$$Q_{OUT} = \{(V_{DC} + 2V_P) - V_S\} C (a1Z^{-1} + a3Z^{-2} + ...) \quad (14)$$
$$= \{(V_{DC} + 2V_P) - V_S\} C \cdot Z^{-1} (a1 + a3Z^1 + ...)$$

That is a signal current Io is derived from the collector of transistor 16 which corresponds to the successive samples of the input signal delayed by 0, $\tau$, $2\tau$, ..., weighted by a1, a3, a5, ... and then added. Since the formula for the output signal is multiplied by $Z^{-1}$, the filter delays the most recent sample by $\tau$ before providing an output. However, since the characteristic of the filter is determined by the term $(a1 + a3Z^{-1} + ...)$, a filter having a characteristic similar to the one in FIG. 3 can be formed by proper adjustment of the values of the constants a1, a3, ...

The average or mean value $I_{AV}$ of the collector current of transistor 16 is expressed as follows:

$$I_{AV} = Q_{OUT}/\tau = Q_{OUT} f_c \quad (15)$$

Figure 6:
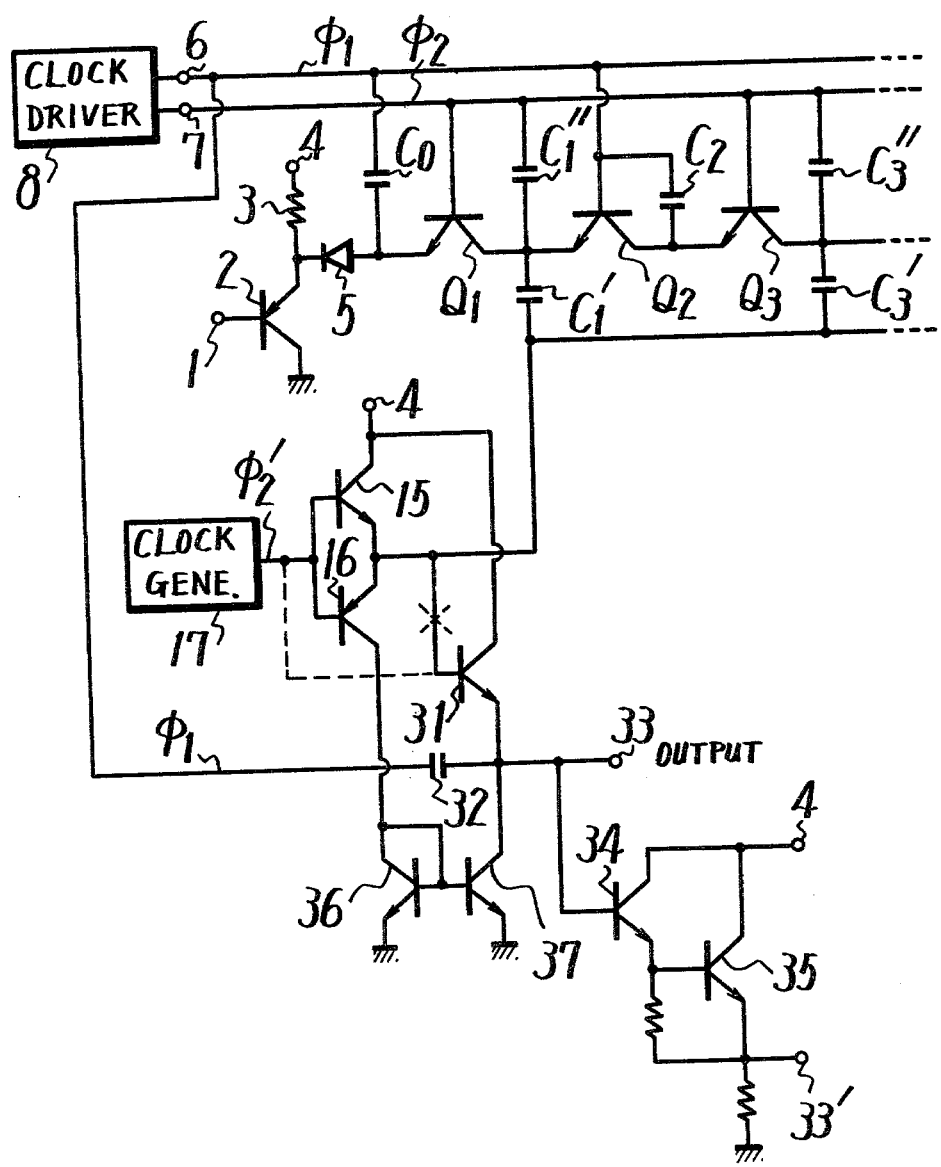

FIG. 6 is an embodiment of the invention otherwise similar to that shown on FIG. 5, except that the output is a voltage rather than a current. The collector of transistor 16 is grounded through the collector-emitter path of an NPN transistor 36 which, together with an NPN transistor 37, forms a current mirror circuit. The emitter of transistor 37 is grounded and its collector is connected to the emitter of transistor 31 and to capacitor 32. The base of transistor 31 is connected to the connection point of the emitters of transistors 15 and 16 at which a signal equivalent to clock signal $\phi_2$ is obtained. Output terminal 33 is connected to the connection point of transistors 31 and 37.

The base of transistor 31 receives a signal equivalent to clock signal $\phi_2$. Capacitor 32 is driven by clock signal $\phi_1$, and during the periods when clock signal $\phi_1$ assumes the voltage $V_{DC}+V_P$, transistors 16 and 37 are turned ON to discharge capacitor 32. Thus, an output voltage $V_{OUT}$ is produced in a manner similar to circuit of FIG. 4 as follows:

$$V_{OUT} = \frac{C}{C_A} (a1 + a3Z^{-1} + ...)Z^{-1} \cdot V_{SAC} + \quad (16)$$
$$\frac{V_P C_A - (V_{DC} + 2V_P - V_{SDC})(a1 + a3 + ...)C}{C_A} + V_{DC} + V_P$$

Emitter followers 34 and 35 may be used to remove the DC offset as in the circuit of FIG. 4.

The base of transistor 31 may alternatively be connected to clocking signal generator 17 as shown by the broken line. In this case, the output voltage $V_{OUT}$ is expressed as follows:

$$V_{OUT} = V_{S1} + V_{BE} \quad (17)$$

Figure 7:
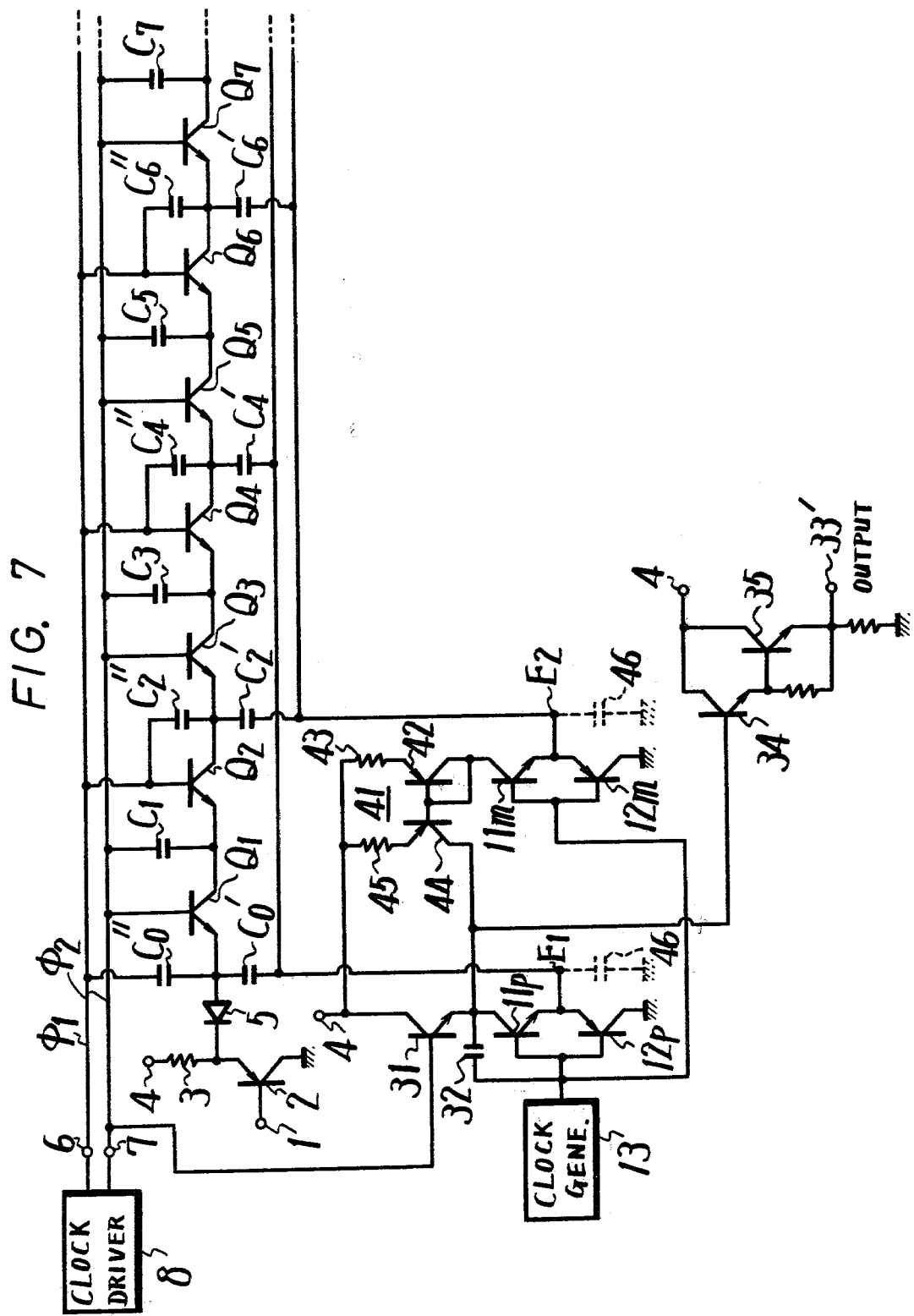

FIG. 7 shows an embodiment of a non-recursive transversal filter according to the present invention using the circuit of FIG. 4 including the broken line connection, but also including an arrangement for using both positive and negative factors or constants. Transistors 11p and 12p form a positive output circuit. The cold sides of selected capacitor portions C0', C4', ..., whose factors a0, a4, ... are positive, are connected together to the connection point between the emitters of transistors 11p and 12p. Transistors 11m and 12m form a negative output circuit. The cold sides of capacitors C2', C6', ..., whose factors a2, a6, ... are negative, are connected together to the connection point between the emitters of transistors 11m and 12.

The collector of transistor 11m is connected to the collector and base of a PNP transistor 42 which, together with a PNP transistor 44 forms a current mirror circuit 41. The emitters of transistors 42 and 44 are connected through resistors 43 and 45 respectively to power supply terminal 4. The bases of transistors 42 and 44 are connected together. Resistors 43 and 45 balance current mirror circuit 41 and generally are selected for equal resistance which may include zero. The collectors of transistors 11p and 44 are connected together to the emitter of transistor 31 and to capacitor 32.

When clock signal $\phi_1$ assumes the value of $V_{DC}+V_P$, a charge of $$\{(V_{DC}+2V_P)-V_S\}C(a0+a4Z^{-2}+ ...)$$

flows from capacitor 32 through transistor 11p to capacitor portions C0', C4', ... During the same periods, a charge of $$\{(V_{DC}+2V_P)-V_S\}C(a2Z^{-1}+a6Z^{-3}+ ...)$$

flows through transistor 11m from capacitor portions C2', C6', ... to current mirror circuit 41. A like charge from current mirror circuit 41 is added to capacitor 32.

The final charge $Q_A$ on capacitor 32 is expressed as follows:

$$Q_A = V_P \cdot C_A - \quad (18)$$
$$\{(V_{DC} + 2V_P) - V_S\} C(a0 + a4Z^{-2} + ...) +$$
$$\{V_{DC} + 2V_P) - V_S\} C(a2Z^{-1} + a6Z^{-3} + ...)$$

Thus, the output voltage $V_{OUT}$ is added to the potential of clock signal $\phi_1$ and hence is expressed as follows:

$$V_{OUT} = \frac{1}{C_A} [V_P C_A - \quad (19)$$
$$\{(V_{DC} + 2V_P) - V_S\} C(a0 + a4A^{-2} + ...)$$
$$+ \{(V_{DC} + 2V_P) - V_S\} C(a2Z^{-1} + a6A^{-3} + ...)]$$
$$+ V_{DC} + V_P$$
$$= \frac{C}{C_A} \{(a0 + a4Z^{-2} + ...) - (a2Z^{-1} + a6Z^{-3} + ...)\} V_S$$
$$+ \frac{1}{C_A} [V_P C_A - (V_{DC} + 2V_P)C\{(a0 + a4Z^{-2} + ...) = (a2Z^{-1} + a6Z^{-3} + ...)\}] + V_{DC} + V_P$$

If it is assumed in formula (19) that $V_S = V_{SDC} + V_{SAC}$ and $Z^{-1} = Z^{-2} = ... 1$, the output voltage $V_{OUT}$ can be expressed as follows:

$$V_{OUT} = \frac{C}{C_A} (a0 = a2Z^{-1} + a4Z^{-2} - a6Z^{-3} + \quad (20)$$
$$...) V_{SAC} + V_{SDC}$$

-continued $$+ (V_{DC} + 2V_P - V_{SDC})\left(1 - \frac{C}{C_A}(a0 - a2 + a4 - a6 + \ldots)\right)$$

In formula (20), the first term is the AC signal term and the second and following terms are the DC signal terms.

Thus, according to the present invention, a very simple non-recursive transversal filter can be provided having a transfer function H(z) of:

$$H(z) = C/C_A(a0 - a2Z^{-1} + a4Z^{-2} - a6Z^{-3} + \ldots) \quad (21)$$

Further, since the capacitors are supplied with clock pulses during normal transfer times, the signal transferred through the bucket brigade device is not affected by the output circuit of FIG. 7.

If the capacitance value of capacitor 32 is taken as $C_A$, which is expressed as follows:

$$C_A = |(a0 + a4 + \ldots) - (a2 + a6 + \ldots)|C \quad (22)$$

the third term of formula (20) becomes zero, and the DC level of the output becomes $V_{SDC}$ from which the DC level shift between the input and output is removed. The transfer function H(z) becomes as follows and the signal gain is lowered.

$$H(z) = \frac{1}{|(a0 + a4 + \ldots) - (a2 + a6 + \ldots)|}(a0 - a2Z^{-1} + \ldots) \quad (23)$$

If the capacitance value $C_A$ of capacitor 32 is taken as $C(=C_A)$, the signal gain is maintained but the following DC level shift is generated.

$$(V_{DC} + 2V_P - V_{SDC})\{1 - (a0 - a2 + a4 - a6 + \ldots)\}$$

In order to remove the above DC level shift, a capacitor 46 may be connected between ground and connection point E1 of the emitters of transistors 11p and 12p or the connection point E2 of the emitters of transistors 11m 12m as shown in dashed line. The capacitance value C′ of capacitor 46 may be selected as follows:

$$C' = k|1 - (a0 - a2 + a4 - a6 + \ldots)|C \quad (24)$$

In the formula (24), k is as follows:

$$k = (V_{DC} + 2V_P - V_{SDC})/V_P \quad (25)$$

which represents the ratio between the peak value $V_P$ of clock signals $\phi 1$ and $\phi 2$ and the difference between the peak value ($V_{DC} + 2V_P$) at the hot side of the respective capacitor in the bucket brigade device and the DC component $V_{SDC}$ of the input signal $V_S$. That is, when $(a0 - a2 + a4 - a6 + \ldots) > 1$, a negative DC level shift is generated due to an excess of DC current discharged from capacitor 32. Thus, when this excess DC current is compensated by the presence of capacitor 46, the DC level shift is removed. The capacitance value C′ of capacitor 46 may be selected as follows to accomplish this compensation:

$$C' = k\{(a0 - a2 + a4 - a6 + \ldots) - 1\}C \quad (26)$$

During the periods when clock signal $\phi 1$ assumes the value $V_{DC} + V_P$, the charge flows to capacitors C0′, C2′, ... and an excess charge expressed by the following formula (27) flows through transistor 11m to capacitor 46.

$$V_P C = (V_{DC} + 2V_P - V_{SDC})\{(a0 - a2 + a4 - a6 + \ldots) - 1\}C \quad (27)$$

Thus, an excess charge of $V_P C'$ is supplied through current mirror circuit 41 to capacitor 32. The shift charge stored in capacitor 32 by the above DC level shift is expressed as follows:

$$|(V_{DC} + 2V_P - V_{SDC})\{1 - (a0 - a2 + a4 - a6 + \ldots)\}|C = (V_{DC} + 2V_P - V_{SDC})\{(a0 - a2 + a4 - a6 + \ldots) - 1\}C \quad (28)$$

This shift charge is cancelled by an excess charge supplied by current mirror circuit 41.

When $(a0 - a2 + a4 - a6 + \ldots) < 1$, a positive DC level shift is caused by an excess charge on capacitor 32. This excess can be cancelled if capacitor 46 connected to point E1, has the following capacitance value C′:

$$C' = k\{1 - (a0 - a2 + a4 - a6 + \ldots)\}C \quad (29)$$

During the periods in which clock signal $\phi 1$ assumes the value $V_{DC} + V_P$, a charge expressed by the following formula (30) flows to capacitor 46.

$$V_P C = (V_{DC} + 2V_P - V_{SDC}) \{1 - (a0 - a2 + a4 - a6 + \ldots)\} C \quad (30)$$

This charge compensates for the DC level shift as in the previous case.

Figure 8:
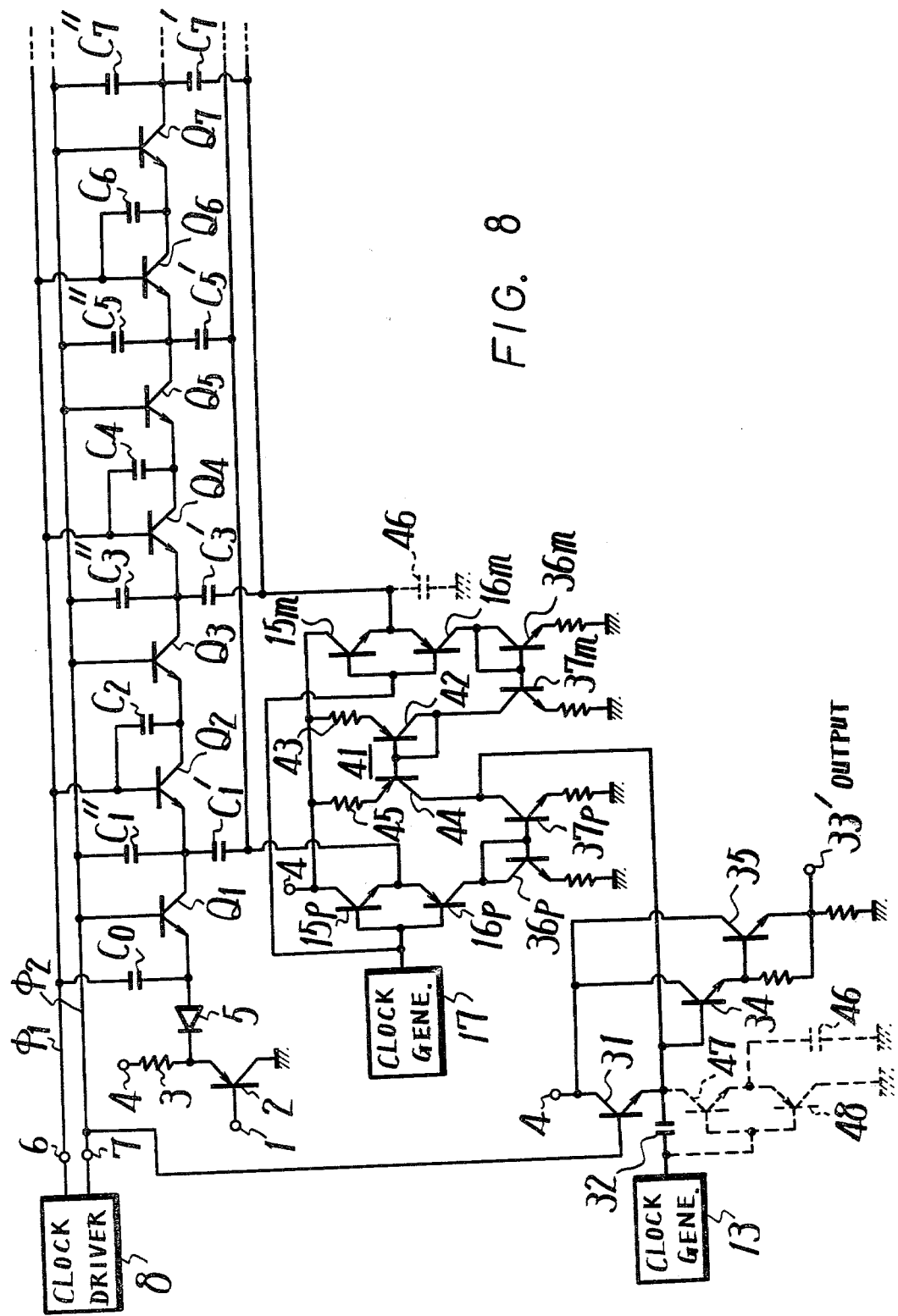

FIG. 8 shows another embodiment of the invention in which a non-recursive transversal filter including positive and negative factors is formed using the circuit of FIG. 6.

Transistors 15p and 16p form a positive output circuit. The cold sides of capacitors C1′, C5′, ..., whose factors (a1, a5, ...) are considered to be positive, are connected together to the connection point between the emitters of transistors 15p and 16p. Transistors 15m and 16m form a negative output circuit. The cold sides of capacitors C3′, C7′, ..., whose factors (a3, a7, ...) are considered to be negative, are connected together to the connection point between the emitters of transistors 15m and 16m. The collector of a transistor 37m in the negative output circuit is connected to the collector and base of transistor 42 and to the base of PNP transistor 44 in current mirror circuit 41. The collector of a transistor 37p, in the positive output circuit, and the collector of transistor 44 of current mirror circuit 41 are connected together to the emitter of transistor 31 and to capacitor 32.

An output voltage $V_{OUT}$ is produced by the circuit of FIG. 8 as follows:

$$V_{OUT} = \frac{C}{C_A}(a1 - a3Z^{-1} + a5Z^{-2} - a7Z^{-3} + \ldots)Z^{-1}V_{SAC} \quad (31)$$

$$+ V_{SDC}$$

$$+ (V_{DC} + 2V_P - V_{SDC})\left(1 - \right.$$

-continued $$\left. \frac{C}{C_A}(a1 - a3 + a5 - a7 + ...) \right\}$$

Thus, a non-recursive transversal filter with a transfer function H(z) expressed by the following formula (32) is formed.

$$H(z)=C/C_A(a1-a3A^{-1}+a5Z^{-2}-a7Z^{-3}+ ...) \quad (32)$$

In this filter, if the capacitance value $C_A$ of capacitor 32 is selected as expressed by the following formula (33), the DC level shift in the output voltage $V_{OUT}$ disappears.

$$C_A=|(a1+a5+ ...)-(a3+a7+ ...)|C \quad (33)$$

If $C_A=C$, a DC level shift expressed by $$(V_{DC}+2\ V_P-V_{SDC})\{1-(a1-a3+a5-a7+ ...)\}$$

is produced. In order to remove this DC level shift, when $(a1-a3+a5-a7+ ...\ )>1$, a capacitor 46, shown in dashed lines, with a capacitance value C' expressed by the following formula (34) may be connected between ground and the connection point of the emitters of transistors 15m and 16m.

$$C'=k|1-(a1-a3+a5-a7+ ...)|C \quad (34)$$

When $(a1-a3+a5-a7+ ...\ )<1$, a DC offset correction circuit, shown in dashed line, consisting of complementary transistors 47, 48 and capacitor 46 may be inserted between the emitter of transistor 31 and ground.

Figure 9:
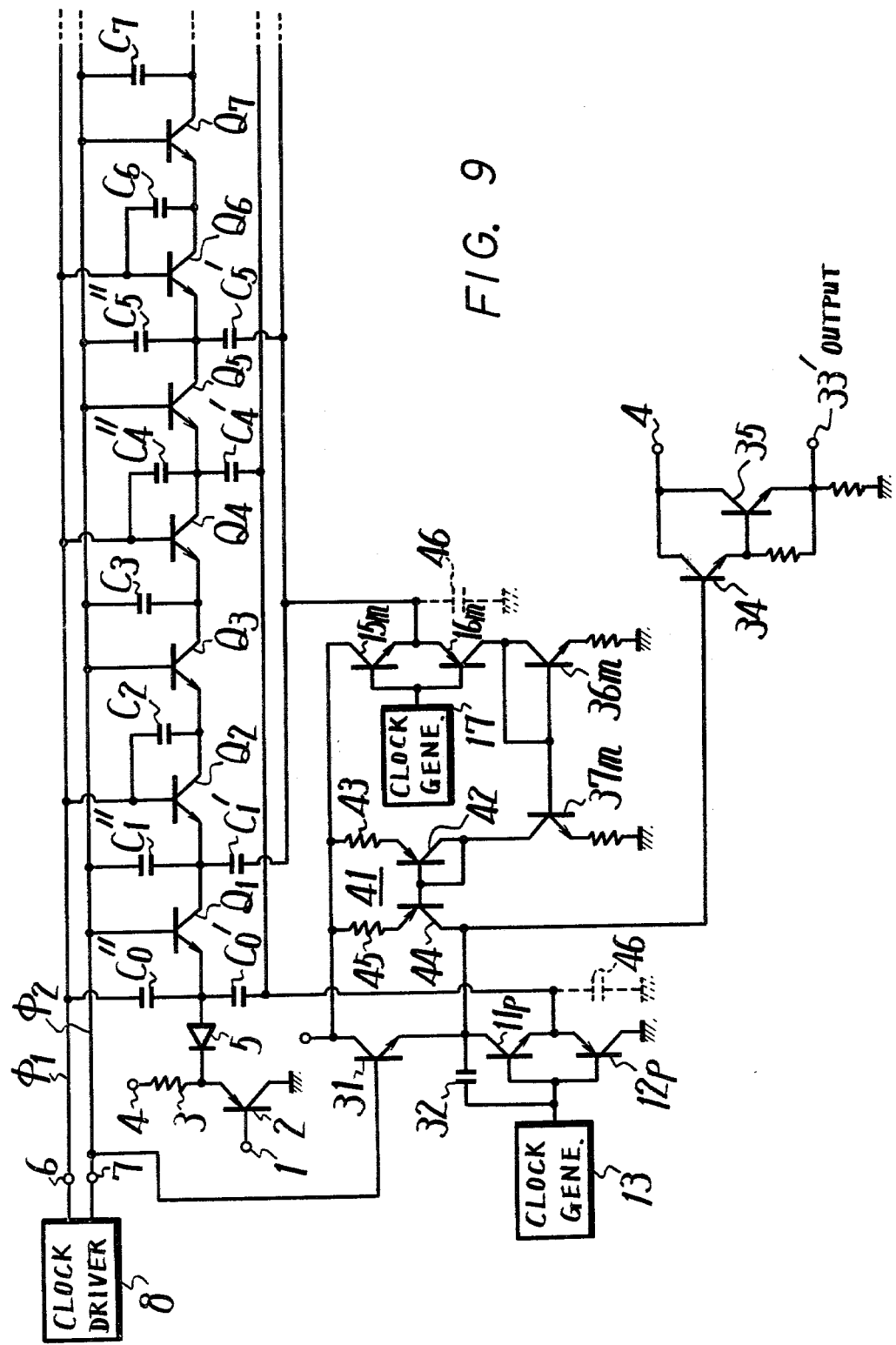

FIG. 9 shows a further embodiment of the invention in which positive factors are derived from a circuit according to FIG. 4 and negative factors are derived from a circuit according to FIG. 6.

The cold sides of capacitors C0', C4, . . . are connected together to the connection point of the emitters of transistors 11p and 12p, and the cold sides of capacitors C1', C5', . . . are connected together to the connection point of the emitters of transistors 15m and 16m. The collectors of transistors 11p and 44 are connected together to transistor 31 and capacitor 32.

The transfer function H(z) of the circuit of FIG. 9 is expressed as follows:

$$H(z)=C/C_A(a0-a1Z^{-1}+a4Z^{-2}-a5Z^{-3}+ ...) \quad (35)$$

The capacitance value of C' of capacitors 46, shown in dashed lines, for removing the DC level shift, may be selected as follows:

$$C'=k|1-(a0-a1+a4-a5+ ...)|C \quad (36)$$

Figure 10:
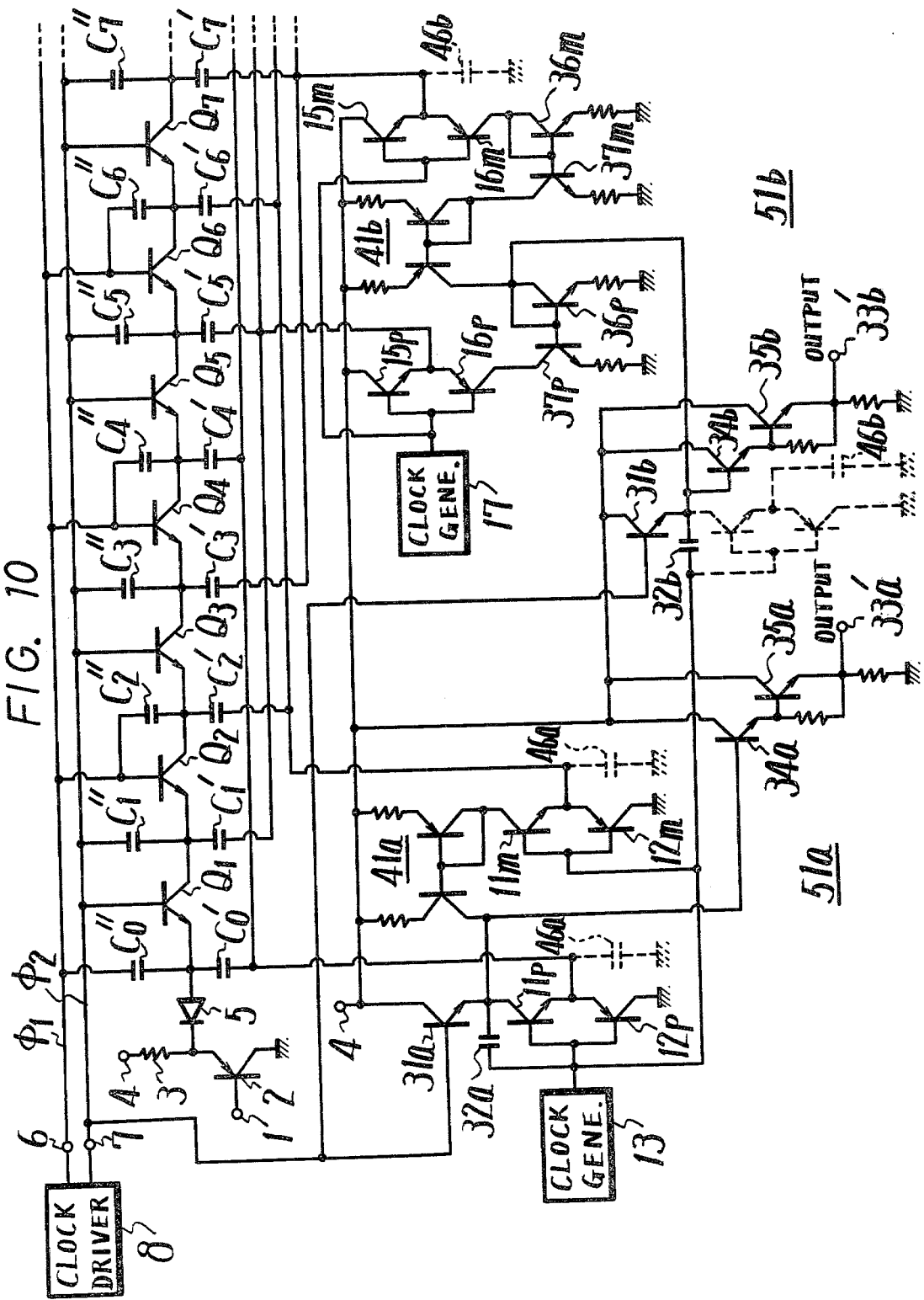

FIG. 10 shows a further embodiment of the invention in which two filtered outputs are derived from a single bucket brigade device using the circuits of FIGS. 7 and 8. The cold sides of capacitors C0', C4', . . . are connected together to transistors 11p and 12p, which form a first filter 51a, and the cold sides of the capacitors C2', C6', . . . are connected together to transistors 11m and 12m. Further, the cold sides of the capacitors C1', C5', . . . are connected together to transistors 15p and 16p, which form a second filter 51b, and the cold sides of capacitors C3', C7, . . . are connected together to transistors 15m and 16m. The transfer functions of the respective filters 51a and 51b are the same as those in the embodiments of FIGS. 7 and 8.

Figure 11:
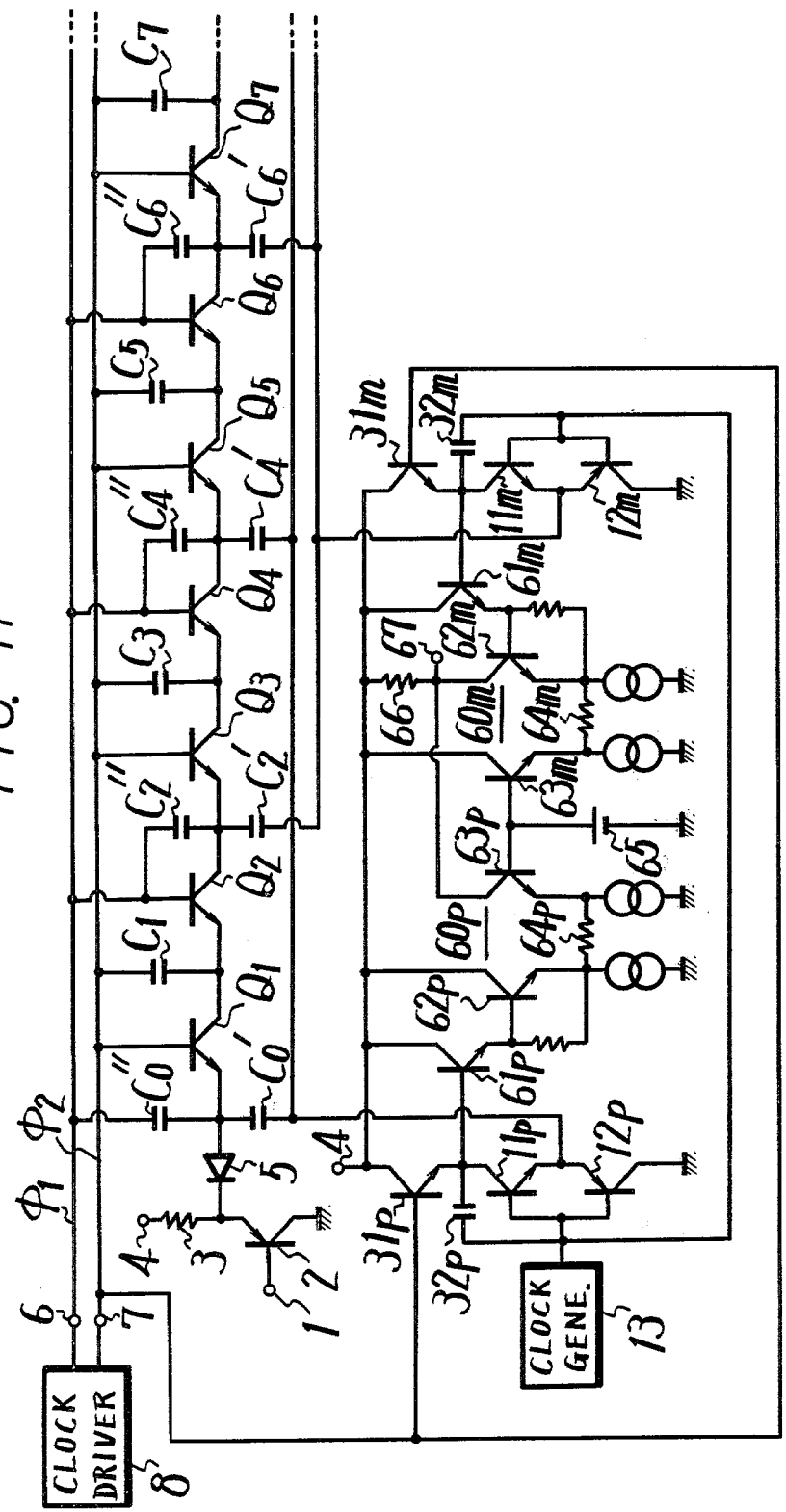

FIG. 11 shows a further embodiment of the invention which employs a differential amplifier in place of current mirror circuit 41 in the circuit of FIG. 7. Capacitors C0', C4', . . . are connected together to transistors 11p and 12p, and the collector of transistor 11p is connected to a transistor 31p and a capacitor 32p. The capacitance value $C_P$ of capacitor 32p is selected as follows:

$$C_P=(a0+a4+ ...)C \quad (37)$$

Capacitors C2', C6', . . . are connected together to transistors 11m and 12m, and the collector of transistor 11m is connected to a transistor 31m and a capacitor 32m. The capacitance value Cm of capacitor 32m is selected as follows:

$$Cm=(a2+a6+ ...)C \quad (38)$$

A signal voltage $V_P$, expressed by the following formula (39), is derived from the collector of transistor 11p.

$$V_P=1/(a0+a4+ ...)\ (a0+a4Z^{-2}+ ...\ )V_{SAC}+V_{SDC} \quad (39)$$

A signal voltage $V_m$, expressed by the following formula (40), is derived from the collector of transistor 11m.

$$Vm=1/(a2+a6+ ...)\ (a2Z^{-1}+a6Z^{-3}+ ...\ )V_{SAC}+V_{SDC} \quad (40)$$

These signals are supplied to a differential amplifier 60p, which consists of transistors 61p, 62p, 63p and a resistor 64p, and to a differential amplifier 60m, which consists of transistors 61m, 62m, 63m and a resistor 64m, respectively. A DC voltage source 65 equal to the DC component $V_{SDC}$ of the input signal is connected to the bases of transistors 63p and 63m. The collectors of transistors 63p and 62m are connected together through a resistor 66 to power supply terminal 4 and also to an output terminal 67.

If it is assumed that the resistance of resistor 64p is $R_p$ and that the resistance of resistor 66 is Ro, the gain of differential amplifier 60p is Ro/Rp. If it is assumed that the resistance of resistor 64m is Rm, the gain of differential amplifier 60m becomes Ro/Rm.

Thus, if resistance Rp and Rm are selected by the following formulas (41) and (42) respectively, the AC component $V_{OAC}$ of the output signal is expressed by formula (43).

$$Rp = \frac{1}{a0 + a4 + ....}\ Ri \quad (41)$$

$$Rm = \frac{1}{a2 + a6 + ....}\ Ri \quad (42)$$

$$V_{OAC} = \frac{Ro}{Ri}(a0 - a2Z^{-1} + a4Z^{-2} - a6Z^{-3} + ...)V_{SAC} \quad (43)$$

Further, a non-recursive transversal filter (not shown) can be also formed using the circuit of FIG. 8 with a differential amplifier in place of the current mirror circuit thereof.

Figure 12:
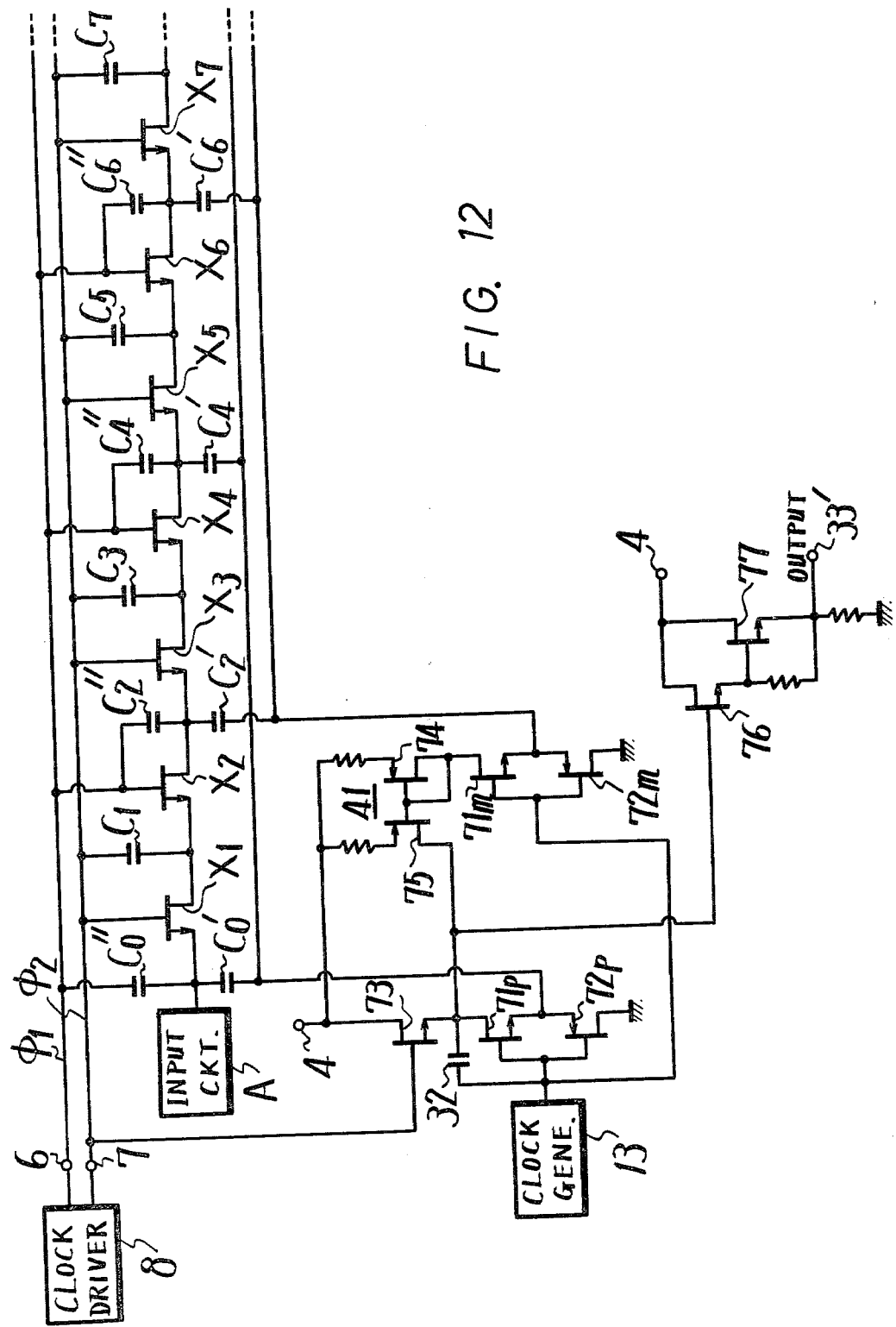
Figure 13:
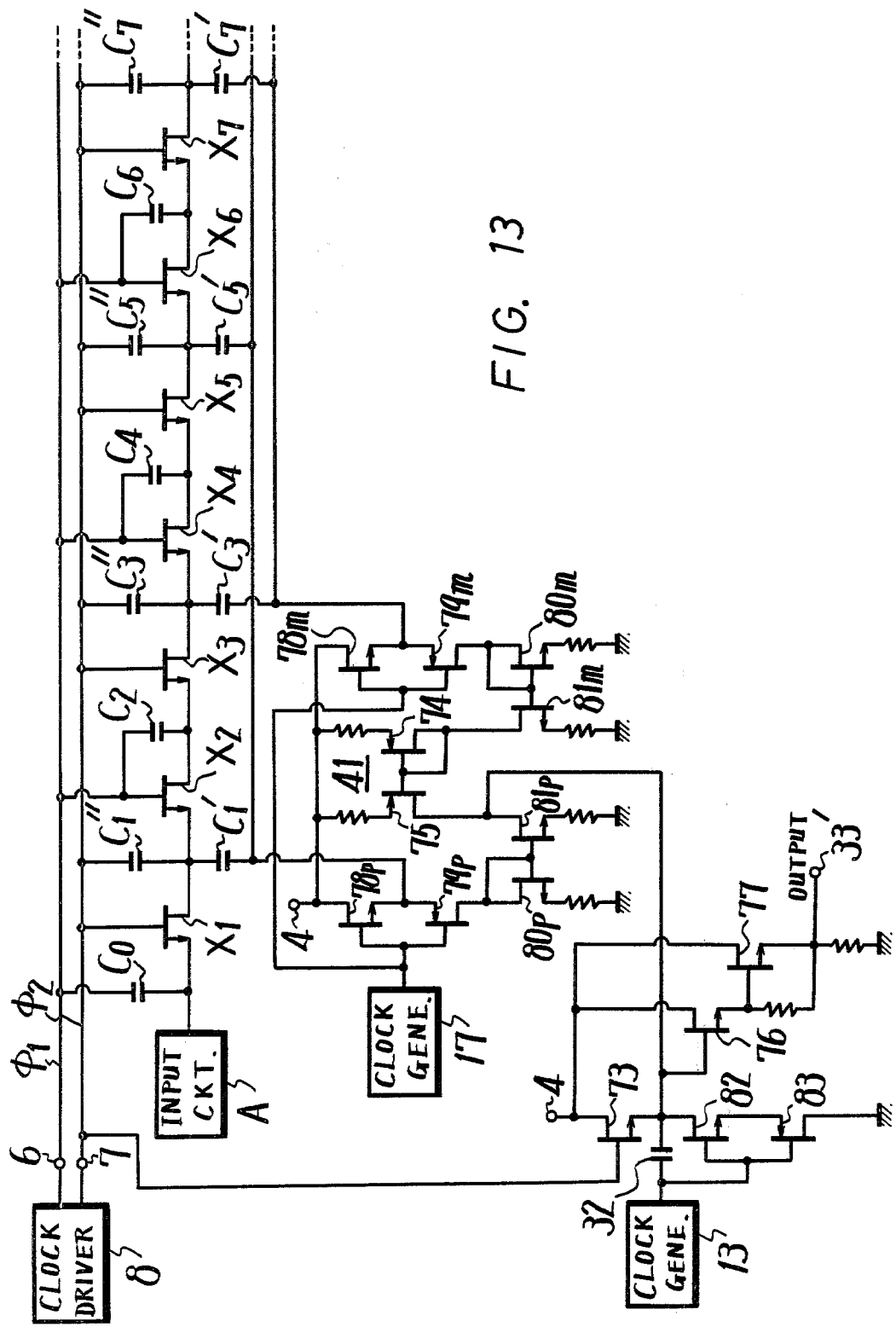

FIGS. 12 and 13 respectively shows further embodiments of the invention in which a bucket brigade device including FETs (field effect transistors) is used. Capacitors C1, C2, . . . are connected between the drains and gates of respective FETs X1, X2, . . . The sources and drains thereof are successively connected together. The gates of every other FET X1, X2, . . . are connected together. The connection points of the gates of even FETs X2, X4, . . . are connected to clock terminal 6. The connection points of the gates of odd FETs X1, X3, . . . are connected to clock terminal 7. Capacitor C0 is connected between an input circuit A and clock terminal 6. In this bucket brigade device, the output circuit employs an enhancement mode MOS FET.

The output of the embodiment of FIG. 12 is derived from divided portions C0', C2', . . . of even capacitors C0, C2, . . . and hence this circuit corresponds to the circuit of FIG. 7. N-channel FETs 71p, 71m, 73, 76 and 77 are used in place of transistors 11p, 11m, 31, 34 and 35 of FIG. 7, and p-channel FETs 72p, 72m, 74 and 75 are used in place of transistors 12p, 12m, 42 and 44 of FIG. 7. FETs 71p, 72p and those 71m, 72m are complementary.

The output of the embodiment of FIG. 13, is derived from divided portions C1', C3', . . . of odd capacitors C1, C3, . . . , and hence this circuit corresponds to the circuit of FIG. 8. N-channel FETs 78p, 78m, 80p, 80m, 81p, 81m and 82 are used in place of transistors 15p, 15m, 37p, 37m, 38p, 38m and 47 of FIG. 8, and p-channel FETs 79p, 79m and 83 are used in place of transistors 16p, 16m and 48 of FIG. 8. The remainder of FIG. 13 is substantially the same as FIG. 12. FETs 78p, 79p; 78m, 79m; and 82 and 83 respectively, are complementary.

If the potential of clock signals $\phi1'$ and $\phi2'$ in the circuits of FIGS. 12 and 13 supplied to the gates of FETs 71p, 72p and 71m, 72m or 78p, 79p and 78m, 79m is set to $V_{DC} - V_{GS}$ and $V_{DC} + V_P + V_{GS}$, where $V_{GS}$ is the voltage drop across the gate-source of FETs 71p, 71m, 78p and 78m when they are conductive, and $V_{GS}'$ is the voltage drop across the gate-source of FETs 72p, 72m, 79p and 79m when they are conductive, the circuits develop an output similar to the circuits in preceding embodiments.

Figure 14:
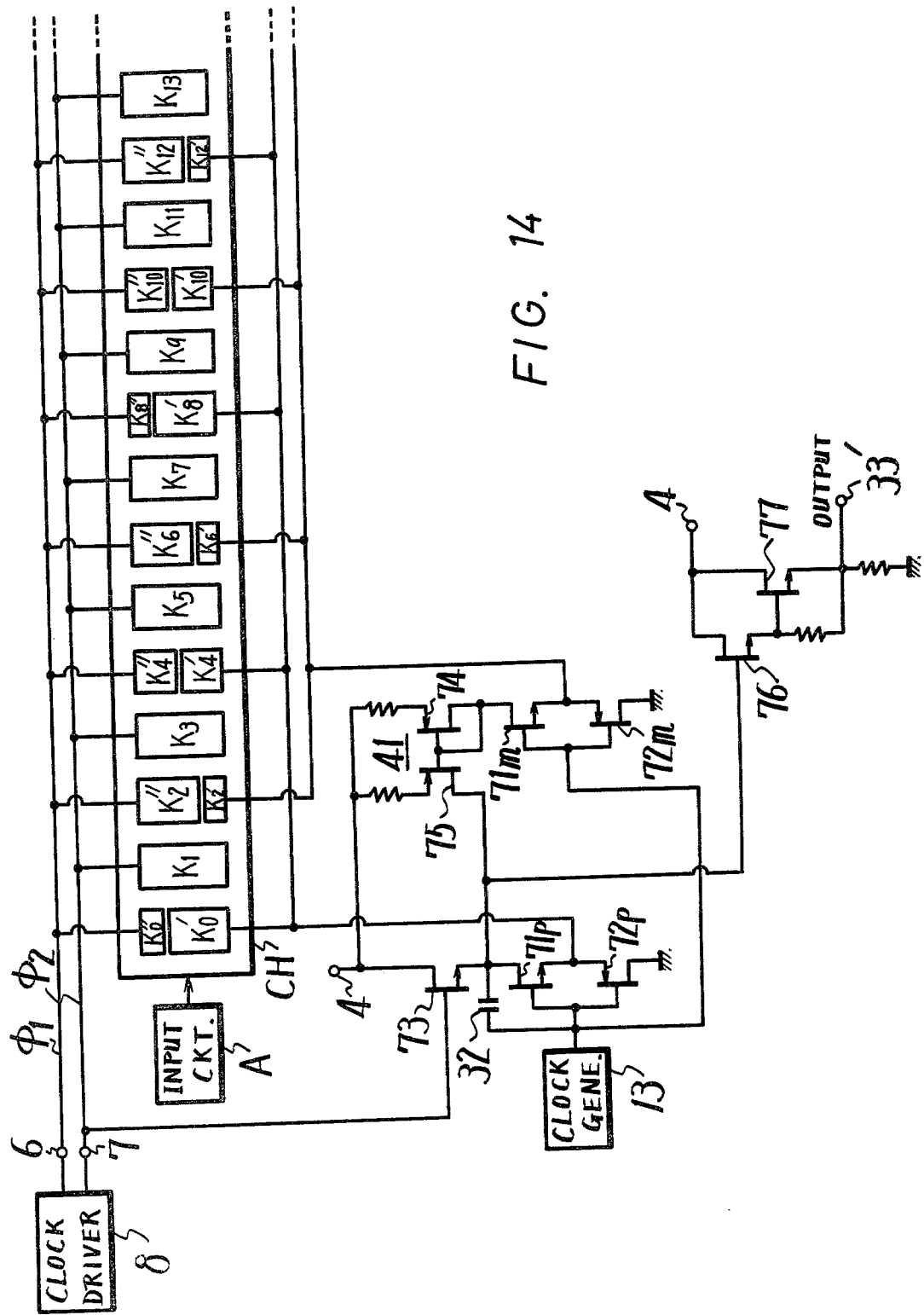
Figure 15:
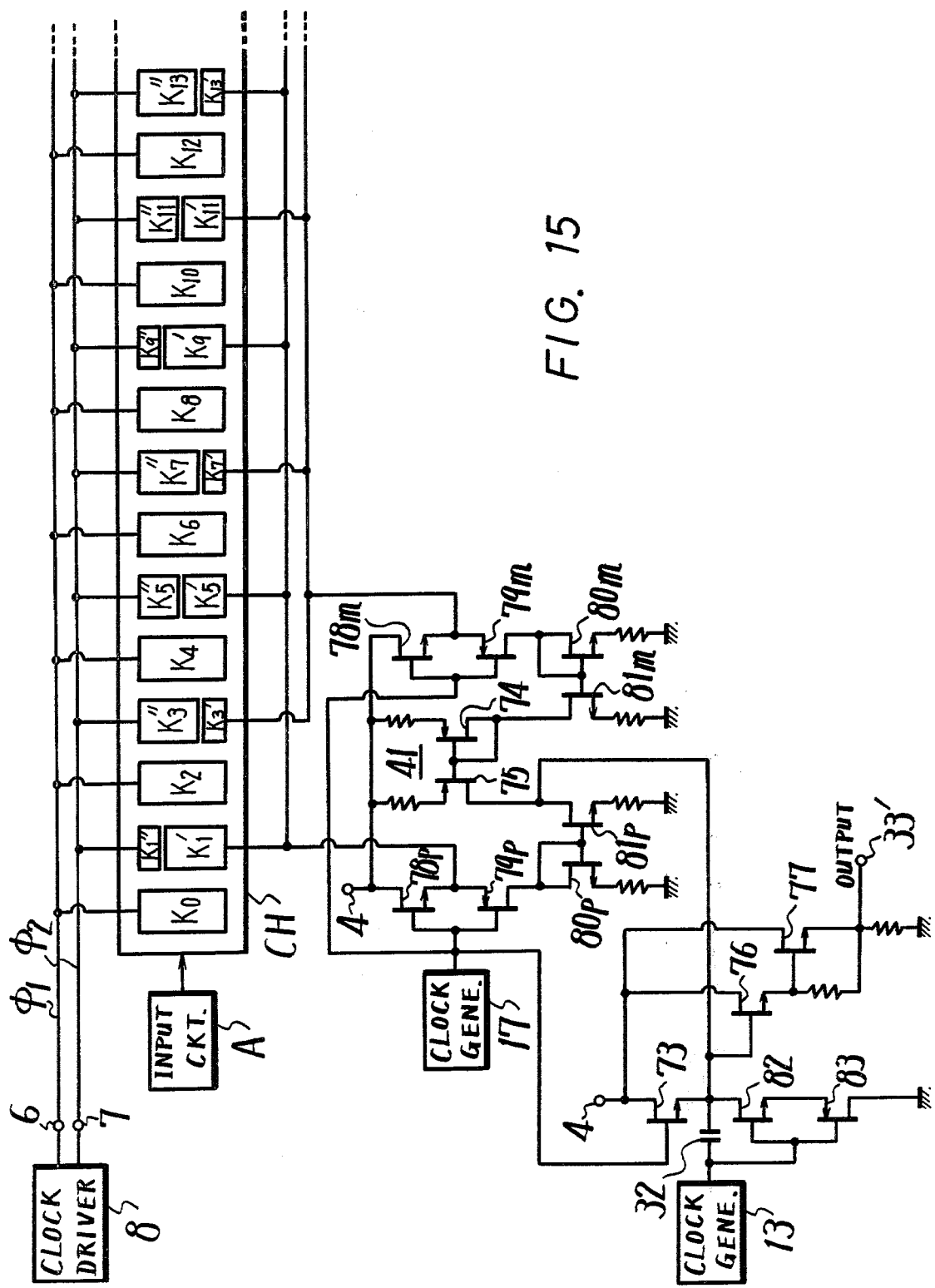

FIGS. 14 and 15 respectively show still further embodiments of the invention using charge coupled devices (CCD). Electrodes K0, K1, . . . each having an area S are provided on the CCD and alternate electrodes are connected together. The connection point of even numbered electrodes K0, K2, . . . is connected to clock terminal 6 and the connection point of odd numbered electrodes K1, K3, . . . is connected to clock terminal 7.

In the embodiment of FIG. 14, an output is derived from even electrodes K0, K2, . . . which are respectively divided into electrodes K0', K0"; K2', K2"; . . . The areas of the electrodes are selected to be a0S, (1-a0)S; a2S, (1-a2)S; . . . One portion of each of divided electrode K0", K2", . . . is connected to clock terminal 6. Certain ones of the other portions of divided electrodes K0', K2', . . . are connected together to the output circuit consisting of FETs 71p and 71m to 77, etc., in a manner equivalent to the output circuit of FIG. 12.

In the embodiment of FIG. 15, an output is derived from odd electrodes K1, K3, . . . which are respectively divided into electrodes K1', K1"; K3', K3"; . . . in a manner similar to the embodiment of FIG. 14. One portion of each divided electrode K1", K3", . . . is connected to clock terminal 7. Certain ones of divided electrodes K1', K3', . . . are connected to the output circuit consisting of FETs 78p and 78m to 83, etc., in a manner equivalent to the output circuit of FIG. 13.

Stray capacitance exists between the electrodes supplied with clock signals $\phi1$ and $\phi2$ and the channel, and the charging and discharging of the stray capacitance depends upon the level of the incoming signal. Accordingly, by dividing the electrodes from which the output is derived in the above circuits, the capacitance can be divided in correspondence with the areas of the divided electrodes. If a separate clock signal is supplied to ones of the divided electrodes, the weighted outputs can be derived similar to the bucket brigade device. The outputs are then added and delivered as the output signal.

Further, since the operation of the filter of the invention is the same as the operation of a normal charge transfer device, the signal transferred through the bucket brigade device, or charge coupled device, or the CCD is unaffected.

Having described specific preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

We claim as our invention:

1. A filter circuit comprising:
   a charge transfer device;
   clock signal drive circuit means including means for supplying a clock signal to said charge transfer device;
   said charge transfer device including a plurality of successive capacitive storage means for sequentially holding a charge level representing a time sampled input signal, each of said capacitive storage means having a first clocking electrode for receiving said clock signal so that said charge level is transferred from one to another of said capacitive storage means in succession in response to said clock signal;
   a predetermined plurality of said plurality of capacitive storage means each including respective first and second capacitive portions, said respective first and second capacitive portions being connected in parallel with each other for said transfer from the respective capacitive storage means to another of said capacitive storage means, said respective first and second capacitive portions having a selected capacitive ratio;
   each of said first capacitive portions having a respective one of said first clocking electrodes for receiving said clock signal, and said second capacitive portions having respective second clocking electrodes;
   a first connection point connected to a predetermined number of said second clocking electrodes;
   a second connection point connected to a remaining number of said second clocking electrodes;
   said clock signal drive circuit means further including first and second clock driver circuits operated in synchronism with said clock signal and connected to said first and second connection points, respectively;

current detecting means for detecting currents flowing through said first and second clock driver circuits, respectively, and output means for compounding the detected currents and deriving an output signal.

2. A filter circuit according to claim 1; wherein said first clock driver circuit includes first and second complementary transistors, each having first, second and control electrodes, said control electrodes of the first and second transistors being commonly connected for being driven in synchronism by said clock signal and said first electrodes thereof being commonly connected to said first connection point; said second clock driver circuit includes third and fourth complementary transistors, each having first, second and control electrodes, said control electrodes of the third and fourth transistors being commonly connected for being driven in synchronism by said clock signal and said first electrodes of the third and fourth transistors being commonly connected to said second connection point; and said current detecting means being effective to detect currents flowing through said second electrodes of said first and third transistors.

3. A filter circuit according to claim 2; wherein said complementary transistors are bipolar transistors each having a base, an emitter and a collector respectively constituting said control, first and second electrodes.

4. A filter circuit according to claim 3; wherein said complementary transistors both operate in active regions.

5. A filter circuit according to claim 2; wherein said complementary transistors are field-effect transistors each having a gate, a source and a drain respectively constituting said control, first and second electrodes.

6. A filter circuit according to claim 2; wherein said output means includes capacitive means connected to said second electrode of said first transistor and also to said second electrode of said third transistor, said capacitive means being charged and discharged in response to both currents flowing through said first and third transistors; and said output signal being derived from said capacitive means.

7. A filter circuit according to claim 6; wherein said first and second clock driver circuits include another capacitive means connected to at least one of said first electrodes of said first and third transistors, said other capacitive means having a capacitance effective to provide DC compensation.

8. A filter circuit according to claim 2; wherein said output means comprises current to voltage converting means connected to said second electrodes of said first and third transistors; and a differential amplifier connected to said converting circuit for compounding voltages therefrom.

9. A filter circuit according to claim 2; wherein said current detecting means comprises a current mirror circuit including an input active device and an output active device, said current flowing through said first transistor being supplied to said input active device and a current in proportion to the current through said input active device flowing through said output active device as a detected current of said first transistor.

10. A filter circuit according to claim 9, wherein said current detecting means comprises another current mirror circuit including an input active device and an output active device, said current flowing through said third transistor being supplied to said input active device and a current in proportion to the current flowing through said input active device flowing through said output active device as a detected current of said third transistor.

11. A filter circuit according to claim 2; wherein said clock signal is composed of two phase clock signals; said first mentioned clocking electrode of each of said capacitive storage means receives one of said two phase clock signals; and each of said first and second clock driver circuits is operated in synchronism with one of said two phase clock signals.

12. A filter circuit according to claim 1; wherein said first clock driver circuit is operated in synchronism with one of said two phase clock signals; and said second clock driver circuit is operated in synchronism with the other of said two phase clock signals.

13. A charge transfer device according to claim 1; wherein each of said capacitive storage means comprises a capacitor having two electrodes, one of said two electrodes being said clocking electrode and the other of said two electrodes being a non-clocking electrode; and further comprising a plurality of transfer transistors of the same polarity, each of said transfer transistors being provided for controlling the transfer of charge from a respective one of said capacitors to a succeeding one of said capacitors and each having a control electrode, an input electrode and an output electrode, said transfer transistors being connected in series at their input and output electrodes, and said non-clocking and clocking electrodes of each of said capacitors being connected to the input and control electrodes; respectively, of a related one of the transfer transistors.

* * * * *